(12) United States Patent
Gilliland et al.

(10) Patent No.: US 6,331,992 B1
(45) Date of Patent: Dec. 18, 2001

(54) SMALL FORMAT OPTICAL SUBASSEMBLY

(75) Inventors: Patrick B. Gilliland, Chicago; Carlos Jines, Forest Park; Theodore Washburn, Barrington, all of IL (US)

(73) Assignee: Stratos Lightwave, Inc., Chicago, IL (US)

( * ) Notice: Subject to any disclaimer, the term of this patent is extended or adjusted under 35 U.S.C. 154(b) by 0 days.

(21) Appl. No.: 09/545,087

(22) Filed: Apr. 7, 2000

(51) Int. Cl.$^7$ ....................................................... H01S 3/19
(52) U.S. Cl. ................................... 372/50; 372/43; 372/36
(58) Field of Search .................................. 372/50, 43, 36, 372/92, 48

(56) References Cited

U.S. PATENT DOCUMENTS

| | | | |
|---|---|---|---|
| 5,812,582 | * 9/1998 | Gilliland et al. | 372/50 |
| 5,815,623 | 9/1998 | Gilliland et al. | 385/93 |
| 6,014,476 | 1/2000 | Meyer-Guldner et al. | 385/14 |

OTHER PUBLICATIONS

Data Sheet—MLC–25–4–X–TL Optical Gigabit Ethernet–+ 3.3V (10 pages), Methode Electronics, Inc., Optoelectronic Products.
Data Sheet—Preliminary Technical Specification of 1.3um MQW–FP Laser Diode Module: (Transmitter Optical Sub–assembly) SLT2160–LN Seriers, Sumitomo Electric Industries, Ltd., (6 pages)—Oct. 5, 1999.
Drawing No. 230–019, "1300 nm Laser Diode MTS," Methode Electronics, Inc., Jan. 25, 1999.
Photocopy of photograph of Methode Electronics, Inc.'s 1300 nm Laser Diode MTS.

* cited by examiner

*Primary Examiner*—Leon Scott, Jr.
(74) *Attorney, Agent, or Firm*—Karl D. Kovach; David L. Newman

(57) ABSTRACT

A small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an optical diode, a monitor diode, and conductors between the electrically conductive can and the non-electrically conductive substrate. The non-electrically conductive substrate has three through-holes formed through a thickness of the non-electrically conductive substrate. The three through-holes are filled with an electrically conductive material so as to form three electrically conductive vias. Additionally, a surface of the non-electrically conductive substrate is organized into three regions. The first and third regions have the electrically conductive plating material applied thereto. The first through-hole protrudes through the first region. The second and third through-holes protrude through the second region. The first via is electrically connected to the electrically conductive plating material adhered to the first region. The optical diode and the monitor diode both have leads which are mounted on the electrically conductive plating of the first region. A first conductor electrically connects another lead of the optical diode to the second via, and a second conductor electrically connects another lead of the monitor diode to the third via.

44 Claims, 8 Drawing Sheets

SMALL FORMAT OPTICAL SUBASSEMBLY

BACKGROUND OF THE INVENTION

1. Field of the Invention

The present invention pertains to optoelectronic devices or optical subassemblies. The invention more particularly concerns a small format optoelectronic package.

2. Discussion of the Background

Optoelectronic devices such as optical transceivers are known in the art and include active optical devices or diode packages. Common diode packages include LED packages such as a TO-46 package or a 5.6 mm TO style laser diode package such as an RLD-85PC diode package by Rohm, Incorporated. These diode packages or TO cans typically include a metallic housing having a laser diode or LED for transmitting data and a photo diode for performing power-monitoring, metal contact leads exiting from the diodes for connection to a power source and a cover glass opposed to the diode, through which the energy is transmitted. Discussion of the power-monitoring and feedback control of the laser diode by the photo diode is presented in U.S. Pat. Nos. 5,812,582 and 5,815,623. U.S. Pat. Nos. 5,812,582 and 5,815,623 are hereby incorporated herein by reference. The TO can is hermetically sealed. Often, optics housings arc metallic so as to provide ruggedness, ease of machining complicated shapes, and to enhance shielding of electromagnetic fields.

Smaller optoelectronic packages allow the devices into which the optoelectronic packages are placed to become smaller. Smaller optoelectronic packages allow for a higher density of data transmission in a given space. Currently, the re is a great demand for smaller optoelectronic packages.

FIG. 8 is a partial cross-sectional pictorial view of an optoelectronic package 200. The optoelectronic package 200 includes a base element 212, posts 206, 208, 210, extending through the base element 212 and secured thereto with solidified molten glass 214, a monitor diode 204 mounted on the base element 212, an optical emitting element 202 mounted on the monitor diode 204, a can 218 and lens 216 enclosing the monitor diode 204 and the optical emitting element 202. In an effort to reduce space, the optical emitting element 202 is mounted on top of the monitor diode 204. Electrically conductive posts 206, 208, 210 extend through through-holes in the electrically conductive base element 212. The posts 206, 208, 210 arc electrically insulated from the base element 212 by solidified molten glass 214 which also attaches the posts 206, 208, 210 to the base element 212. The posts 206, 208, 210 arc large as compared to the other components and require a large area for the ir mounting and placement.

At minimum, the diameter across the base element 212 is approximately 3.8 millimeters, as incorporated on the SLT2160-LN series of transmitter optical sub-assemblies manufactured by Sumitomo Electric Industries, Ltd. Thus, if two of the se devices are placed side-by-side, on the same plane, the distance between the optical axes is, hypothetically, at best, 3.8 millimeters. However, typically, the optical axes are separated by 6.25 millimeters, due to packaging constraints as in typical LC duplex transceivers such as Methode Electronics, Inc.'s, part number MLC-25-4X-TL which is described in the data sheet entitled, "MLC-25-4-X-TL Optical Gigabit Ethe rnet −+3.3V Small Form Factor (SFF) Transceiver −1.25 GBaud."

Therefore, the re is a need in the industry for a small format optoelectronic package that has a small diameter and is easy to manufacture. Furthe rmore, the re is a need for an optoelectronic package that can be placed adjacent to another optoelectronic package.

SUMMARY OF THE INVENTION

Therefore, it is an object of the present invention to provide a small format optoelectronic device.

It is still another object of the invention to provide a small format optoelectronic device which is hermetically sealed and economical to manufacture.

Yet another object of the invention is to provide a small format optoelectronic device which is able to be placed adjacent to anothe r small format optoelectronic device.

It is a further object of the invention to provide a small format optoelectronic device which is easy to install, and provides for more efficient utilization of the limited surface area by incorporating rectangular geometry.

In one form of the invention, the small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an optical diode, a monitor diode, and conductors between the electrically conductive can and the non-electrically conductive substrate. The non-electrically conductive substrate has three through-holes formed through a thickness of the non-electrically conductive substrate. The three through-holes are filled with an electrically conductive material so as to form three electrically conductive vias. When co-fired with the substrate, the electrically conductive vias form a hermetic seal. Additionally, a surface of the non-electrically conductive substrate is organized into three regions. The first and third regions have the electrically conductive plating material applied thereto. The first through-hole protrudes through the first region. The second and third through-holes protrude through the second region. The first via is electrically connected to the electrically conductive plating material adhered to the first region. The optical diode and the monitor diode both have leads which are mounted on the electrically conductive plating of the first region. A first conductor electrically connects another lead of the optical diode to the second via, and a second conductor electrically connects another lead of the monitor diode to the third via.

In another form of the invention, two of the small format optoelectronic packages discussed above are placed on the same plane. The optical axis of one package is parallel to the optical axis of the other package. Also, the optical axis of one package is separated from the optical axis of the other package by less than 3.25 millimeters.

In yet another form of the invention, one small format optoelectronic package discussed above which has an optical emitting diode and a monitor diode is placed on the same plane with another small format optoelectronic package discussed above which has only an optical detecting diode. The optical axis of one package is parallel to the optical axis of the other package. Also, the optical axis of one package is separated from the optical axis of the other package by 3.25 millimeters or less.

In still yet another form of the invention, two of the small format optoelectronic packages discussed above are placed on the same plane. Each small format optoelectronic package contains only an optical diode (emitting/receiving). The optical axis of each package is parallel to one another. Also, the optical axis of each package is separated from one another by 3.25 millimeters or less.

Thus, the device of the invention is superior to existing optoelectronic devices. The small format optoelectronic package of the invention eliminates the use of large and bulky components, and replaces the m with smaller components through use of a unique combination of materials and arrangement of the materials. Thus, the device of the invention is smaller than the prior art device.

BRIEF DESCRIPTION OF THE DRAWINGS

A more complete appreciation of the invention and many of the attendant advantages the reof will be readily obtained as the same becomes better understood by reference to the following detailed description when considered in connection with the accompanying drawings, wherein.

DETAILED DESCRIPTION OF THE PRESENTLY PREFERRED EMBODIMENTS

Figure 1:
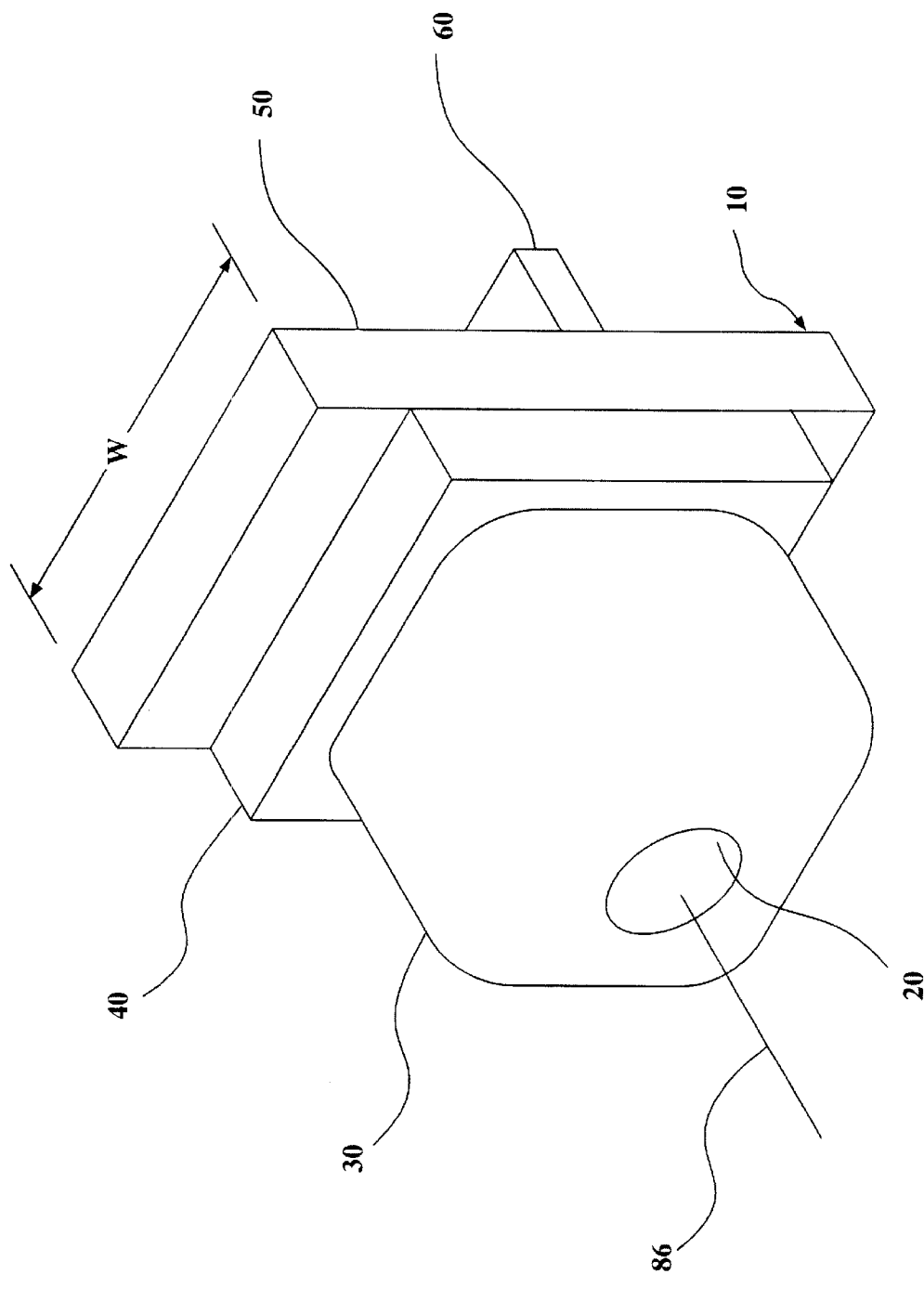
FIG. 1 is a perspective view of an optoelectronic package.
Figure 2:
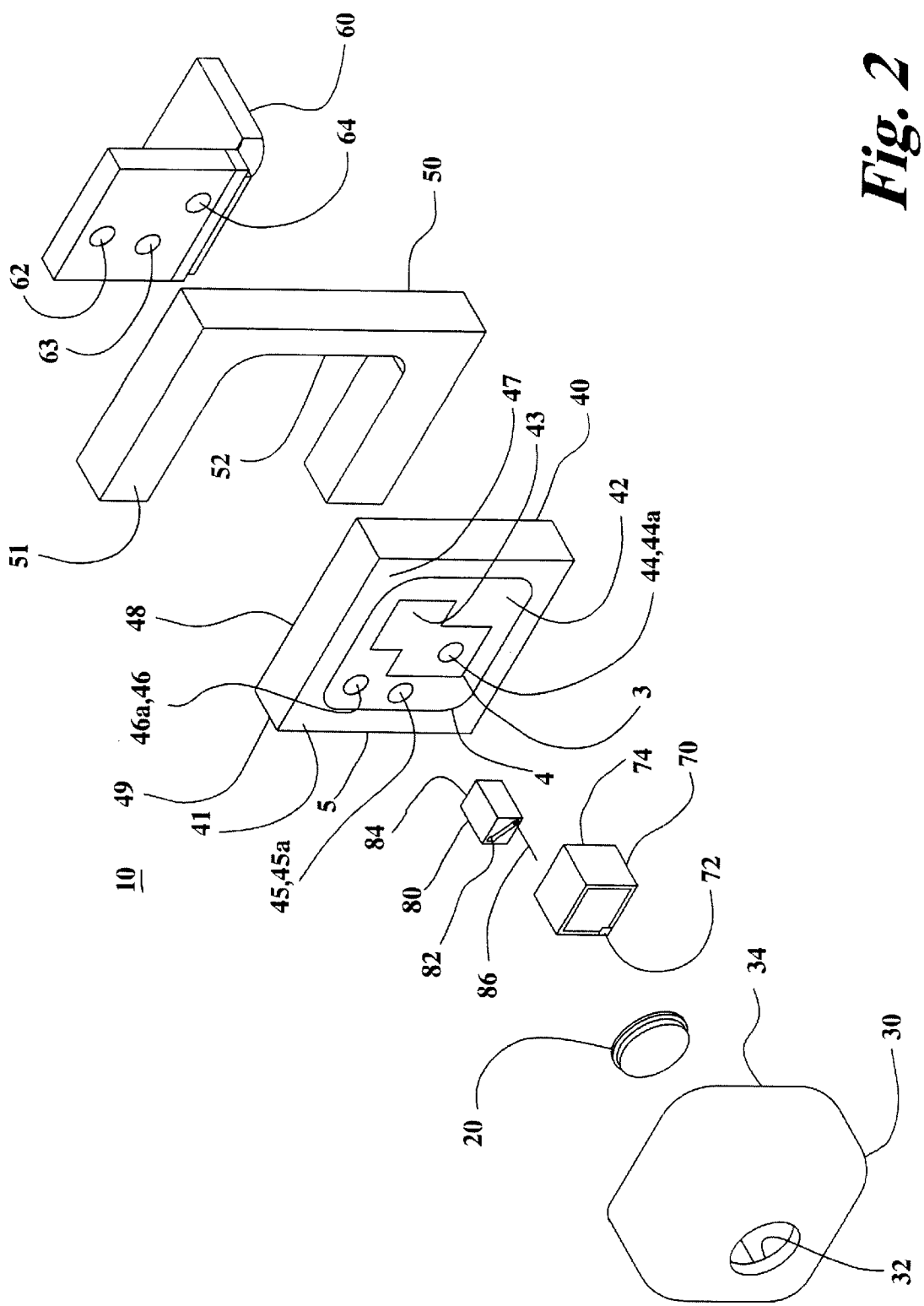
FIG. 2 is an exploded perspective view of the optoelectronic package of FIG. 1.
Figure 3:
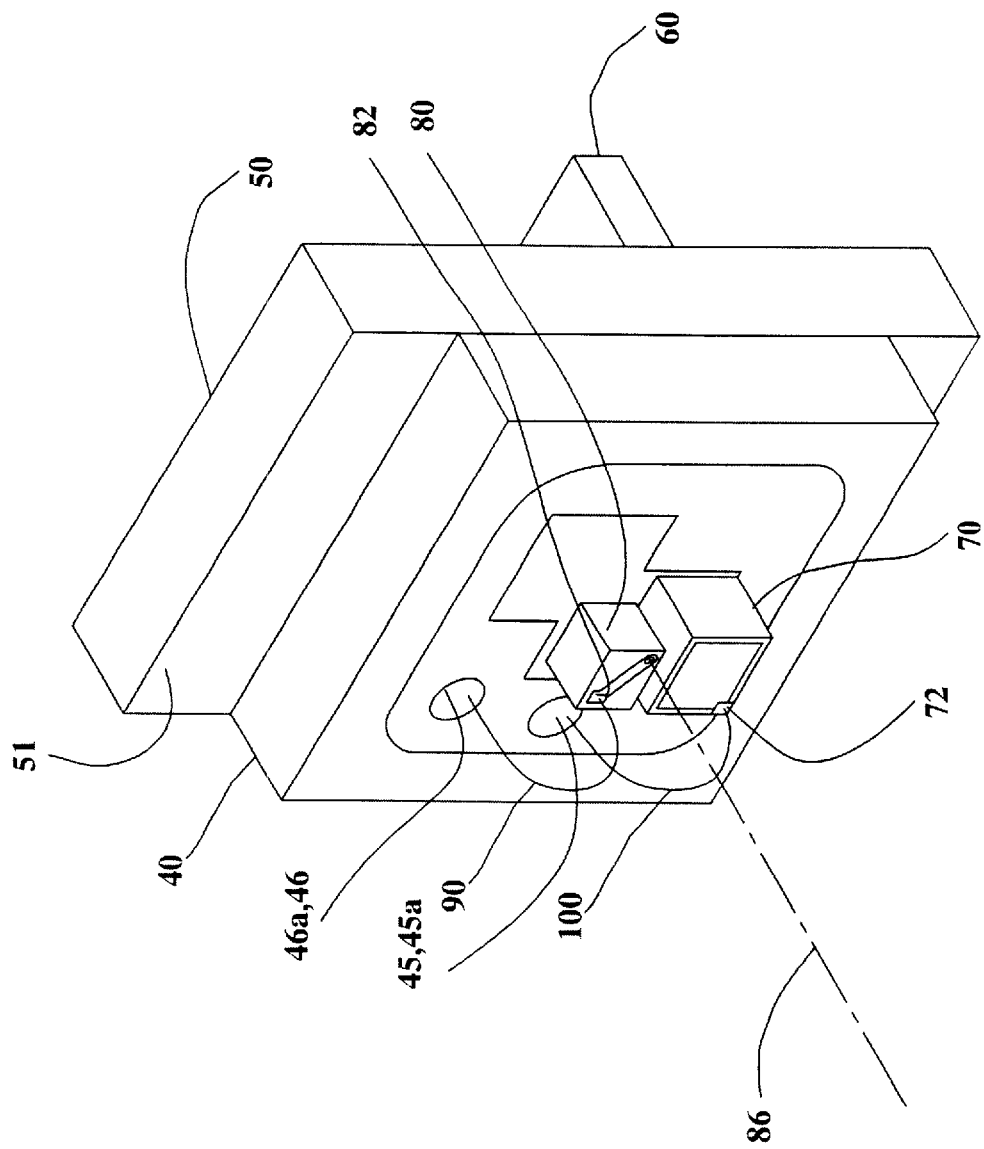
FIG. 3 is a perspective view of the monitor diode, optical diode, base substrate, holder, and flex connector of the optoelectronic package of FIG. 1.

Referring now to the drawings, wherein like reference numerals designate identical or corresponding parts throughout the several views, and more particularly to FIGS. 1–3 the reof, an embodiment of the present invention is a small format optoelectronic package or device 10.

FIG. 1 is a perspective view of the optoelectronic package 10 which shows a transparent element 20 mounted in an electrically conductive can 30, where the electrically conductive can 30 is mounted on and sealed to an electrically conductive plating adhered to a non-electrically conductive substrate. The device 10 can be attached to a housing of another structure by way of the holder 50.

The holder 50 is mounted to the non-electrically conductive substrate 40. The holder 50 has a width dimension W. A flex connector 60 is attached to a second side of the non-electrically conductive substrate 40.

FIG. 2 is an exploded perspective view of the optoelectronic package 10 of FIG. 1. The electrically conductive can 30 has a first aperture 32 and a second aperture 34. The transparent element 20 is mounted on and sealed to the first aperture 32 of the electrically conductive can 30 by means known in the art. One means includes using glass frit powder packed around the transparent element 20 while it is in the first aperture 32 of the electrically conductive can 30 and then firing the assembly so as to cause the glass flit powder to flow and to bond and to hermetically seal the transparent element 20 in the first aperture 32. Another means includes molding or flowing molten glass into the first aperture 32 and letting the molten glass solidify, thus forming the transparent element 20. The non-electrically conductive substrate 40 has a first surface 47 and a second surface 48 separated by a thickness as identified along edge 49, the thickness is between 0.008 inches and 0.025 inches. The first surface 47 is divided into 3 regions. The first region 43 is bound by line 3. The second region 42 is bound by lines 3 and 4. The third region 41 is bound by lines 4 and 5. The regions include a first region 43, a second region 42, and a third region 41. The first region 43 is separated from the third region 41 by the second region 42.

The non-electrically conductive substrate 40 includes three through-holes. The three through-holes include the first through-hole 44, a second through-hole 46, and a third through-hole 45. Each through-hole has a diameter of approximately 0.010 inches. An electrically conductive plating or coating is adhered to the first surface 47 of the non-electrically conductive substrate 40 in the first region 43 and in the third region 41. The plating typically has a thickness of 0.003 inches. Furthermore, the electrically conductive material, which can be the same as the plating material, substantially fills the first through-hole 44, the second through-hole 46, and the third through-hole 45, so as to form first, second, and third conductive vias 44a, 46a, and 45a, respectively. Each electrically conductive via is substantially co-planar with the surfaces 47, 48 of the non-electrically conductive substrate 40. Specifically, the vias do not substantially protrude into the space defined by the transparent element 20, the electrically conductive can 30, and the non-electrically conductive substrate 40, so as to enable surface mounting of components directly on top of the vias. The first conductive via is electrically connected to the electrically conductive plating of the first region 43. The optical diode 80 has a first lead 82 and a second lead 84. The optical emitting diode 80 has an optical axis 86 along which optical energy is transmitted. The second lead 84 of the optical diode 80 is electrically connected to an electrically conductive plating of the first region 43 and mounted the reto by way of electrically conductive epoxy (not shown). The monitor diode 70 has a first lead 74 and a second lead 72. The first lead 74 of the monitor diode 70 is electrically connected to the electrically conductive plating of the first region 43. The monitor diode 70 is mounted to the electrically conductive plating of the first region 43 by way of electrically conductive epoxy (not shown). A longitudinal axis of the first through-hole 44 passes through the monitor diode 70. However, the optical diode 70 can be placed over the first through-hole 44 instead of the monitor diode 80.

To attach the holder 50 to the non-electrically conductive substrate 40, a portion of the second surface 48 has the electrically conductive plating adhered the reto and to which the holder 50 is either brazed or soldered. Alternatively, glass flit powder can be placed between the holder 50 and the non-electrically conductive substrate 40 and the n the assembly is fired so as to bond the holder 50 to the non-electrically conductive substrate.

The electrically conductive can 30 is the n mounted on and sealed to the third region 41 of the non-electrically conductive substrate 40. The electrically conductive can 30 is soldered to electrically conductive plating adhered to the third region 41. The optical emitting diode 80 and monitor diode 70 are hermetically sealed and protected from atmospheric and environmental contaminants. Preferably, the sealed-off region is filled with a dry inert gas. Examples of the inert gas include nitrogen and argon. In another embodiment, the sealed-off region is in a vacuum. The holder 50 has a first surface 51 and a concave portion 52. The first surface 51 is soldered to electrically conductive plating adhered to the non-electrically conductive substrate.

The flex connector 60 has three conductive traces, which includes a first conductive trace 64, a second conductive trace 62, and a third conductive trace 63. The flex connector 60 may be formed of a polyimide film, such a material is marketed Linder the trade name, KAPTON, which is sold by E. I. Du Pont de Nemours and Company. The conductive traces 62, 63, and 64 transmit electrical data and power signals to the diodes 70, 80. The flex connector 60 passes through the concave portion 52 of the holder 50 and each of the conductive traces electrically connects with respective electrically conductive vias. That is, the first conductive trace 64 electrically connects to conductive via 44a, electrically conductive trace 62 electrically connects to electrically conductive via 46a, and electrically conductive trace 63 electrically connects to electrically conductive via 45a.

FIG. 3 is a perspective view of the monitor diode 70, the optical diode 80, the non-electrically conductive substrate 40, the holder 50, and the flex connector 60 of the small format optoelectronic package 10 of FIG. 1. FIG. 3 shows the optical diode 80 and the monitor diode 70 mounted to the first region 43 of the non-electrically conductive substrate 40. FIG. 3 further shows the optical axis 86 of the optical diode 80. A first conductor 90, for example, a wire bond, electrically connects the first lead 82 of the optical diode 80 to the electrically conductive material filling the second through-hole 46 or to a metallized region surrounding the via. A second conductor 100 electrically connects the second lead 72 of the monitor diode 70 to the electrically conductive material filling the third through-hole 45 or to a metallized region surrounding the via.

The holder 50 needs to be solderable and weldable, as well as having a coefficient of the rmal expansion which generally is the same as the coefficient of the rmal expansion of the non-electrically conductive substrate 40 which is a ceramic material. Such materials include FeNi and FeNiCo. Specifically, a material having twenty-nine percent Ni, seventeen percent Co, and the balance Fe trades under the name KOVAR, the name is owned by Carpenter Technology Corporation. The flex connector 60 has a base substrate made of a flexible insulating material such as KAPTON and on which electrically conductive traces are laid. Non-electrically conductive substrate 40 is made of a ceramic material such as alumina, AlN or BeO. The electrically conductive plating material is typically made of a mixture of glass, palladium, and silver which is mixed together, applied to the ceramic material, and heated to a molten state and allowed to solidify. The glass component of the mixture fuses with the base ceramic material of the non-electrically conductive substrate 40. The palladium/silver component of the mixture provides for the electrical conductivity of the plating. The electrically conductive can 30 is typically made of an alloy, such as KOVAR, which has a coefficient of thermal expansion which generally is the same as the coefficient of the rmal expansion for both the non-electrically conductive substrate 40 which is ceramic and the transparent element 20 which is glass. The electrically conductive can 30 is attached to the electrically conductive plating material adhered to the third region 41 of the non-electrically conductive substrate 40 in order to form a hermetic barrier. The electrically conductive can 30 is attached to the non-electrically conductive substrate 40, preferably, by a soldering process or by a brazing process. The transparent element 20 is made of glass or sapphire. The conductors 90, 100 are substantially made of gold and are affixed to the vias 45a, 46a and to the leads 72, 82 by way of a gold bond technique where the gold conductor touches the lead, which is held at a temperature above ambient, or via and is vibrated. An exposed surface of the vias may have a secondary plating of gold to enhance wire bond adhesion. The vibrations and the elevated temperature cause the gold conductor to adhere to the lead.

Figure 8:
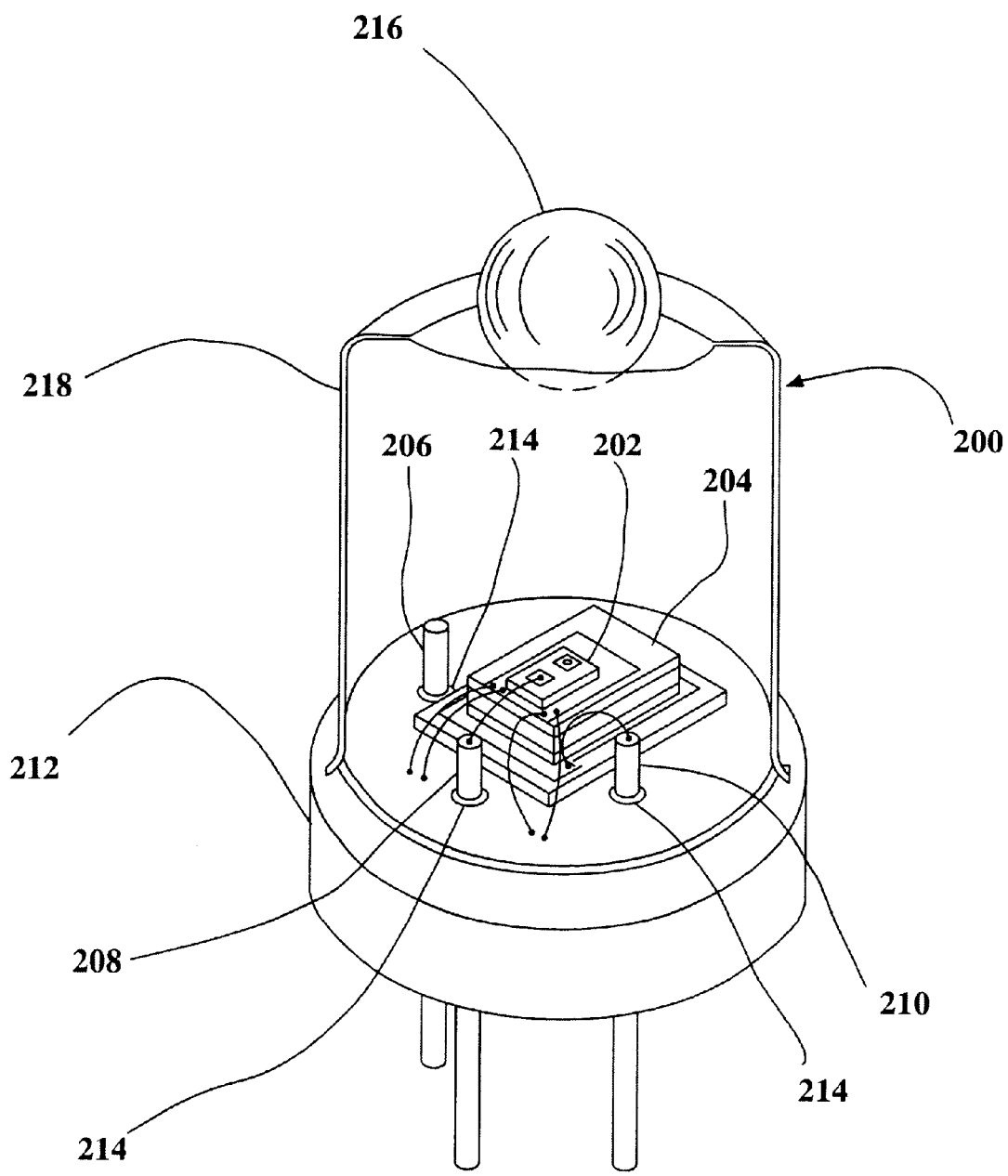
FIG. 8 is a partial cross-sectional perspective view of a related optoelectronic package.

The unique combination of materials and arrangement of components allows the width dimension W to be 3.25 millimeters or less. The optical axis 86 is positioned midway along the width dimension W. As compared to the device 200 of the related art shown in FIG. 8, the device 10 of FIG. 1 is compact. The non-electrically conductive substrate 40 has electrically conductive vias 44a, 45a, and 46a, and electrically conductive regions 41 and 43, which forms an unique electrical circuit arrangement based on geometry and material selection. The non-electrically conductive substrate 40 also has a unique shape which is rectangular or square. The shape and materials of construction allow two or more of the devices 10 to be placed together, and eliminate the wasted area present on the device 200 of FIG. 8.

Figure 7:
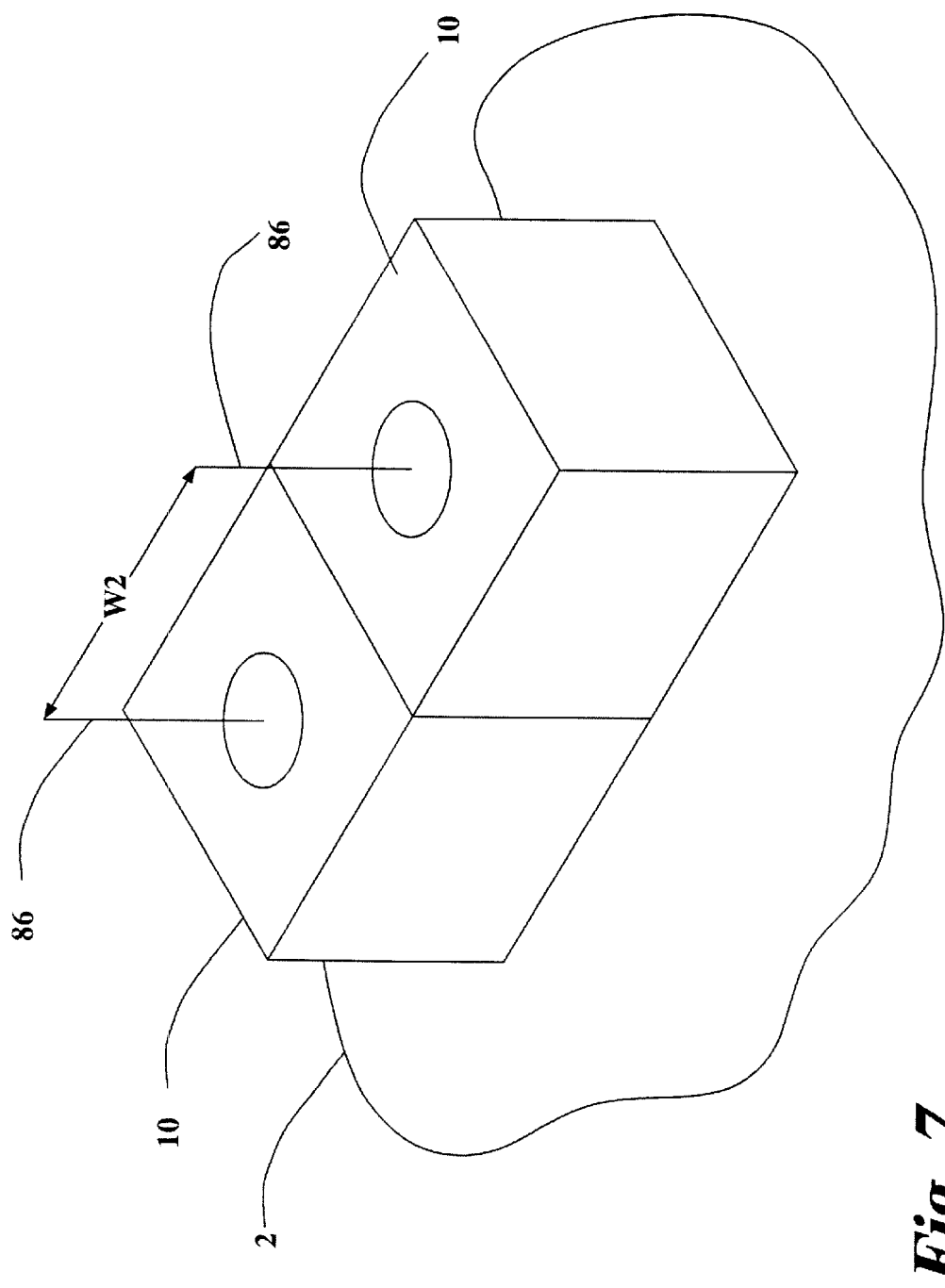
FIG. 7 is a perspective view of two optoelectronic packages positioned side-by-side on a planar surface.

The structure of the small format optoelectronic package or device 10 allows for two of the devices 10, 10 to be placed on the same plane 2 adjacent to each other, as shown in FIG. 7. In such an arrangement, the optical axis 86 of each device 10 are separated by a distance, W2. The distance, W2, is 3.25 millimeters or less.

Figure 4:
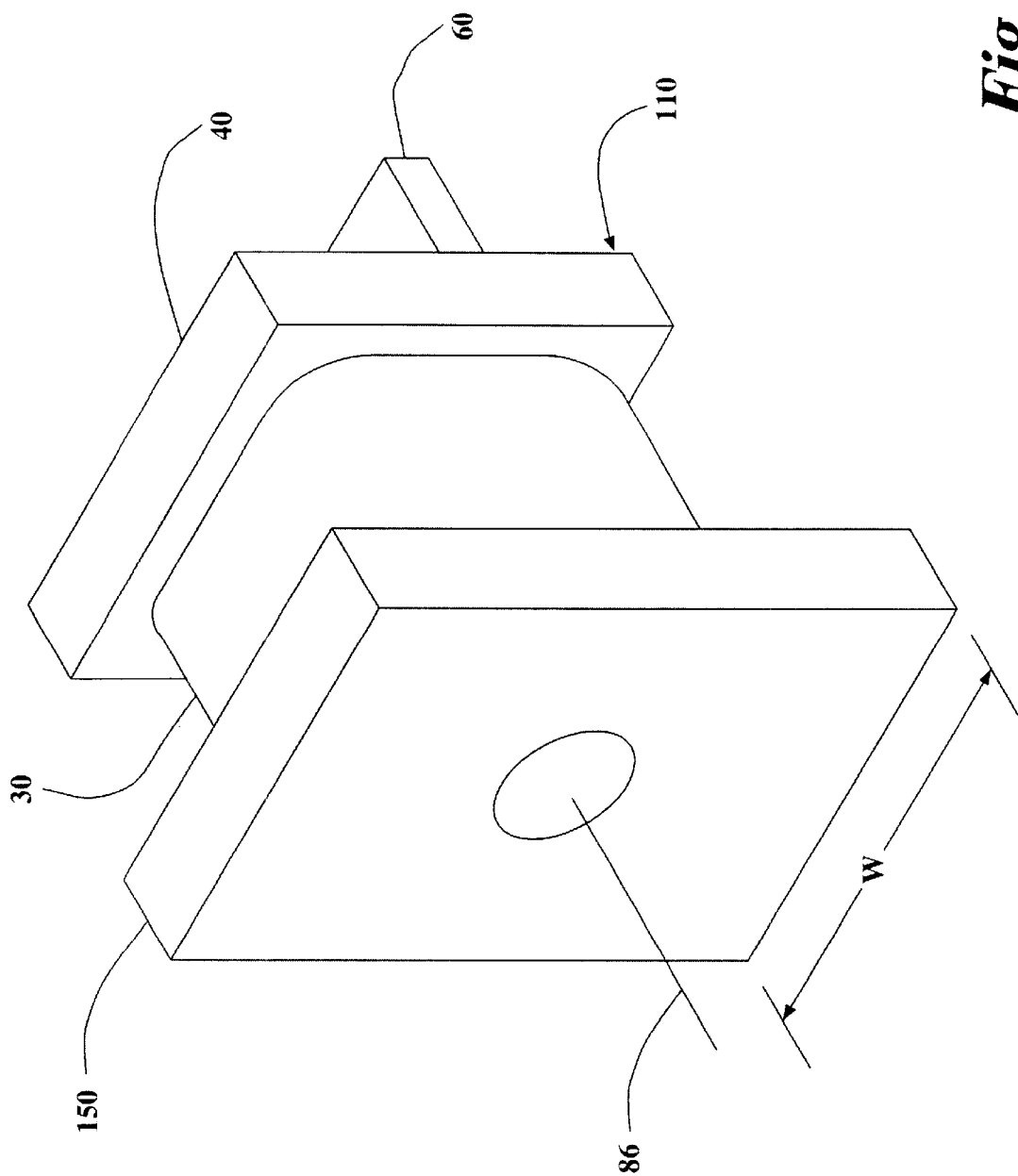
FIG. 4 is a perspective view of a second embodiment of the optoelectronic package.
Figure 5:
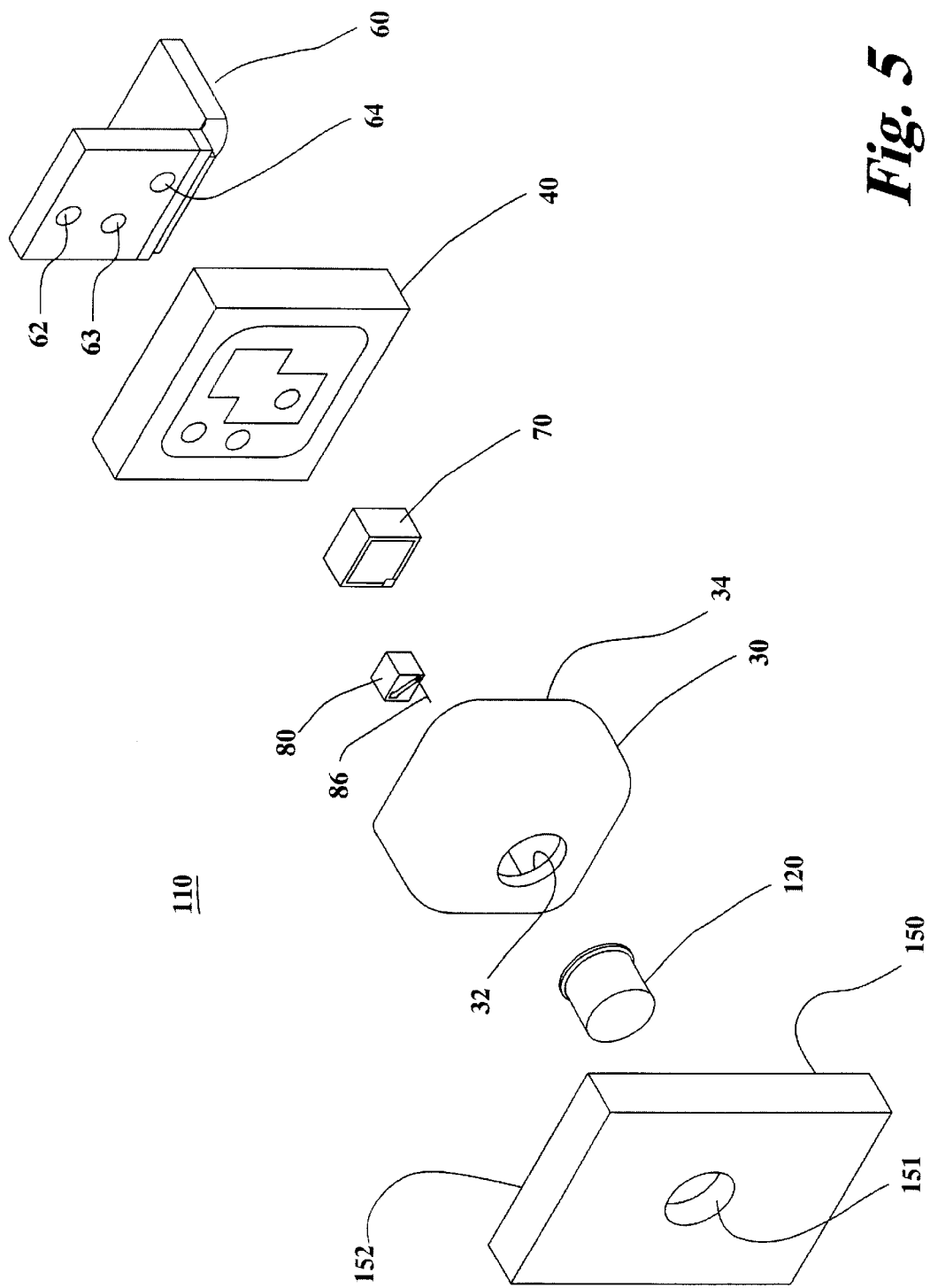
FIG. 5 is an exploded perspective view of the optoelectronic package of FIG. 4.
Figure 6:
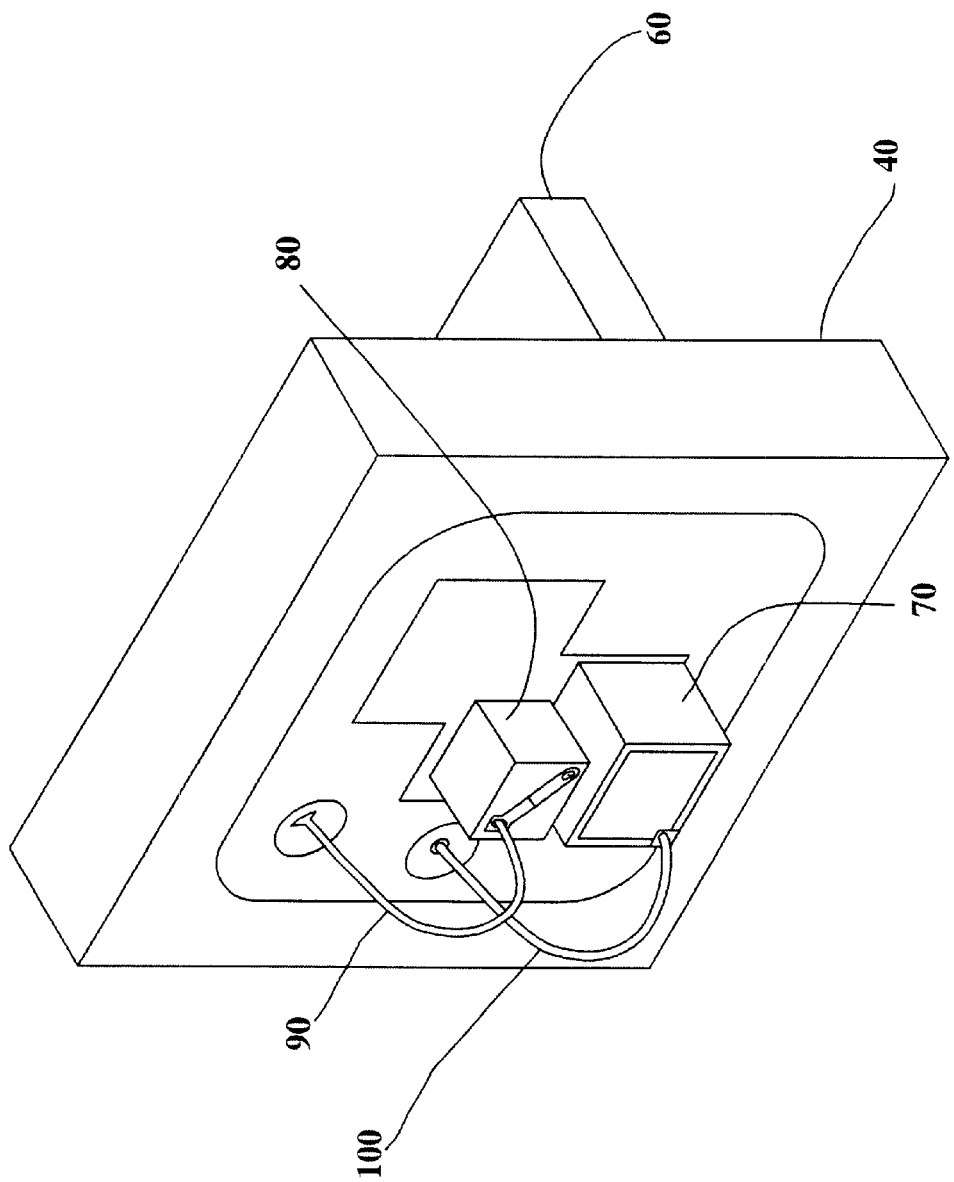
FIG. 6 is a perspective view of the monitor diode, optical diode, base substrate, and flex connector of the optoelectronic package of FIG. 4.

FIGS. 4–6 show a second embodiment of the small format optoelectronic package or device 110. The device 110 includes many of the same components as does the device 10. The device 110 includes the optical diode 80, the monitor diode 70, the non-electrically conductive substrate 40, the flex connector 60, the electrically conductive can 30, and first and second conductors 90, 100. Since the listed components are the same as previously discussed in regard to device 10 they are not discussed further in the discussion of the embodiment of device 110.

A transparent element 120 is mounted on and sealed to the first aperture 32 of the electrically conductive can 30. A holder 150 has an aperture 151 and a surface 152. The aperture 151 receives the transparent element 120. The surface 152 of the holder 150 is brazed or welded to the electrically conductive can 30. The device 110 can be mounted within another housing by way of the holder 150 from a location of the electrically conductive can 30 which is different than the device 10. The materials of construction are similar to those discussed in regard to the device 10.

The invention can also be used in a device similar to that described above where the package does not include a monitor diode and its associated conductor.

In another embodiment, the holder and the electrically conductive can are made of a non-magnetic material.

In still yet another embodiment, a laser driver circuit, a PIN diode amplifier, or other signal conditioning electronic components are placed within the space defined by the non-electrically conductive substrate, the transparent element, and the electrically conductive can.

Obviously, numerous modifications and variations of the present invention are possible in light of the above teachings. For example, the optical diode may be a detector photo diode or a laser such as a vertical cavity surface emitting laser (VCSEL) or a Fabry Perot device or a light emitting diode. Therefore, the present invention may provide a transmitting optical subassembly (TOSA) or a receiving optical subassembly (ROSA). It is the refore to be understood that within the scope of the appended claims, the invention may be practiced otherwise than as specifically described herein.

What is claimed is:

1. An optoelectronic package comprising:
   a non-electrically conductive substrate having a first surface and a second surface, the first surface separated from the second surface by a thickness of the non-electrically conductive substrate, the first surface having a first region, a second region, and a third region, the first region having a first through-hole extending through the thickness, the second region having a second through-hole extending through the thickness and a third through-hole extending through the thickness, the first region being separated from the third region by the second region;
   an electrically conductive plating substantially covering both the first region and the third region of the first surface;
   an electrically conductive material substantially filling the first through-hole so as to form a first electrically conductive via, the electrically conductive material substantially filling the second through-hole so as to form a second electrically conductive via, and the electrically conductive material substantially filling the third through-hole so as to form a third electrically conductive via, and the electrically conductive planing substantially covering the first region being electrically connected to the electrically conductive material substantially filling the first through-hole;
   an optical diode having a first lead and a second lead, the first lead of the optical diode electrically connected to the electrically conductive plating of the first region, the first lead of the optical diode electrically connected to the first electrically conductive via, the second lead of the optical diode electrically connected to the second electrically conductive via, the optical diode having an optical axis;
   a monitor diode having a third lead and a fourth lead, the third lead of the monitor diode electrically connected to the electrically conductive plating of the first region, the third lead of the monitor diode electrically connected to the first electrically conductive via, the fourth lead of the monitor diode electrically connected to the third electrically conductive via;
   an electrically conductive can having a first aperture and a second aperture; and
   a transparent element mounted on and sealed to the first aperture of the electrically conductive can, and wherein the second aperture of the electrically conductive can is mounted on and sealed to the electrically conductive plating adhered to the third region of the non-electrically conductive substrate so as to hermetically seal the monitor diode and the optical diode from an ambient atmosphere, and wherein
      the first through-hole has a longitudinal axis, and wherein the longitudinal axis of the first through-hole passes through at least one of the optical diode and the monitor diode, and wherein
      the optical axis of the optical diode passes through the transparent element, and whereby
         a conductive substrate and posts are absent so as to reduce a size of the optoelectronic package.

2. The optoelectronic package according to claim 1 further comprising a holder mounted to the second surface of the non-electrically conductive substrate.

3. The optoelectronic package according to claim 2, further comprising a flex connector mounted on the second surface of the non-electrically conductive substrate, the flex connector having a first trace, a second trace, and a third trace, wherein the first trace is electrically connected to the first via, wherein the second trace is electrically connected to the second via, and wherein the third trace is electrically connected to the third via.

4. The optoelectronic package according to claim 1, further comprising a flex connector mounted on the second surface of the non-electrically conductive substrate, the flex connector having a first trace, a second trace, and a third trace, wherein the first trace is electrically connected to the first via, wherein the second trace is electrically connected to the second via, and wherein the third trace is electrically connected to the third via.

5. The optoelectronic package according to claim 4, further comprising a holder mounted to the electrically conductive can near the second aperture and the transparent element.

6. The optoelectronic package according to claim 1 wherein the transparent element, the electrically conductive can, and the non-electrically conductive substrate form a space separate from the ambient atmosphere and is substantially filled with an inert gas.

7. The optoelectronic package according to claim 1, further comprising a first conductor electrically connecting the second lead of the optical diode to the second electrically conductive via.

8. The optoelectronic package according to claim 7, further comprising a second conductor electrically connecting the second lead of the monitor diode to the third electrically conductive via.

9. The optoelectronic package according to claim 8 wherein the first conductor is made of a gold material.

10. The optoelectronic package according to claim 9 wherein the second conductor is made of a gold material.

11. The optoelectronic package according to claim 10 wherein the non-electrically conductive substrate is made of a ceramic material.

12. The optoelectronic package according to claim 11 wherein the electrically conductive plating is made of a solidified molten mixture of silver and glass, and wherein the electrically conductive material is made of the solidified molten mixture of silver and glass.

13. The optoelectronic package according to claim 12, further comprising a holder mounted to the second surface of the non-electrically conductive substrate.

14. The optoelectronic package according to claim 13, further comprising a flex connector mounted on the second surface of the non-electrically conductive substrate, the flex connector having a first trace, a second trace, and a third trace, wherein the first trace is electrically connected to the first via, wherein the second trace is electrically connected to the second via, and wherein the third trace is electrically connected to the third via.

15. The optoelectronic package according to claim 14 wherein the transparent element, the electrically conductive can, and the non-electrically conductive substrate form a space separate from the ambient atmosphere and is filled with an inert gas.

16. The optoelectronic package according to claim 15 wherein the non-electrically conductive substrate has a rectangular shape.

17. The optoelectronic package according to claim 16 wherein the electrically conductive can has a rectangular shape.

18. The optoelectronic package according to claim 1 wherein the non-electrically conductive substrate has a rectangular shape.

19. The optoelectronic package according to claim 18 wherein the electrically conductive can has a rectangular shape.

20. The optoelectronic package according to claim 1 wherein the device is a transmitting optical subassembly.

21. The optoelectronic package according to claim 1 wherein the device is a receiving optical subassembly.

22. An optoelectronic package comprising:
a non-electrically conductive substrate having a first surface and a second surface, the first surface separated from the second surface by a thickness of the non-electrically conductive substrate, the first surface having a first region, a second region, and a third region, the first region having a first through-hole extending through the thickness, the second region having a second through-hole extending through the thickness, the first region being separated from the third region by the second region;
an electrically conductive plating substantially covering both the first region and the third region of the first surface;
an electrically conductive material substantially filling the first through-hole so as to form a first electrically conductive via, and the electrically conductive material substantially filling the second through-hole so as to form a second electrically conductive via, and the electrically conductive plating substantially coveting the first region being electrically connected to the electrically conductive material substantially filling the first though-hole;
an optical diode having a first lead and a second lead, the first lead of the optical diode electrically connected to the electrically conductive plating of the first region, the first lead of the optical diode electrically connected to the first electrically conductive via, the second lead of the optical diode electrically connected to the second electrically conductive via, the optical diode having an optical axis;
an electrically conductive can having a first aperture and a second aperture; and
a transparent element mounted on and sealed to the first aperture of the electrically conductive can, and wherein
the second aperture of the electrically conductive can is mounted on and sealed to the electrically conductive plating adhered to the third region of the non-electrically conductive substrate so as to hermetically seal the monitor diode and the optical diode from an ambient atmosphere, and wherein
the first through-hole has a longitudinal axis, and wherein the longitudinal axis of the first through-hole passes through the optical diode, and wherein the optical axis of the optical diode passes through the transparent element, and whereby
a conductive substrate and posts are absent so as to reduce a size of the optoelectronic package.

23. The optoelectronic package according to claim 22 wherein the non-electrically conductive substrate has a rectangular shape.

24. The optoelectronic package according to claim 23 wherein the electrically conductive can has a rectangular shape.

25. The optoelectronic package according to claim 22 wherein the device is a transmitting optical subassembly.

26. The optoelectronic package according to claim 22 wherein the device is a receiving optical subassembly.

27. Optoelectronic packages comprising:
a first non-electrically conductive substrate having a first surface and a second surface, the first surface separated from the second surface by a thickness of the first non-electrically conductive substrate, the first surface having a first region, a second region, and a third region, the first region having a first through-hole extending through the thickness, the second region having a second through-hole extending through the thickness and a third through-hole extending through the thickness, the first region being separated from the third region by the second region;
an electrically conductive plating substantially covering both the first region and the third region of the first surface;
an electrically conductive material substantially filling the first through-hole so as to form a first electrically conductive via, the electrically conductive material substantially filling the second through-hole so as to form a second electrically conductive via, and the electrically conductive material substantially filling the third through-hole so as to form a third electrically conductive via, and the electrically conductive plating substantially covering the first region being electrically connected to the electrically conductive material substantially filling the first through-hole;
a first optical diode having a first lead and a second lead, the first lead of the first optical diode electrically connected to the electrically conductive plating of the first region, the first lead of the first optical diode electrically connected to the first electrically conductive via, the second lead of the first optical diode electrically connected to the second electrically conductive via, the first optical diode having a first optical axis;
a first monitor diode having a third lead arid a fourth lead, the third lead of the first monitor diode electrically connected to the electrically conductive plating of the first region, the third lead of the first monitor diode electrically connected to the first electrically conductive via, the fourth lead of the first monitor diode electrically connected to the third electrically conductive via;
a first electrically conductive can having a first aperture and a second aperture;
a first transparent element mounted on and sealed to the first aperture of the first electrically conductive can, and wherein
the second aperture of the first electrically conductive can is mounted on and sealed to the electrically conductive plating adhered to the third region of the non-electrically conductive substrate so as to hermetically seal the first monitor diode and the first optical diode from an ambient atmosphere, and wherein
the first through-hole has a longitudinal axis, and wherein the longitudinal axis of the first through-hole passes through at least one of the first optical diode and the first monitor diode;
a second non-electrically conductive substrate having a third surface and a fourth surface, the third surface separated from the fourth surface by a thickness of the second non-electrically conductive substrate, the third surface having a fourth region, a fifth region, and a sixth region, the fourth region having a fourth through-hole extending through the thickness, the fifth region having a fifth through-hole extending through the thickness and a sixth though-hole extending through the thickness;

the electrically conductive plating substantially covering both the fourth region and the sixth region of the third surface;

the electrically conductive material substantially filling the fourth through-hole so as To form a fourth electrically conductive via, the electrically conductive material substantially filling the fifth through-hole so as to form a fifth electrically conductive via and the electrically conductive material substantially filling the sixth through-hole so as to form a sixth electrically conductive via, and the electrically conductive plating substantially coveting the fourth region being electrically connected to the electrically conductive material substantially filling the fourth through-hole;

a second optical diode having a fifth lead and a sixth lead, the fifth lead of the second optical diode electrically connected to the electrically conductive plating of the fourth region, the fifth lead of the second optical diode electrically connected to the fourth electrically conductive via, the sixth lead of the second optical diode electrically connected to the fifth electrically conductive via, the second optical diode has a second optical axis;

a second monitor diode having a seventh lead and an eighth lead, the seventh lead of the second monitor diode electrically connected to the electrically conductive plating of the fourth region, the seventh lead of the second monitor diode electrically connected to the fourth electrically conductive via, the eighth lead of the second monitor diode electrically connected to the sixth electrically conductive via;

a second electrically conductive can having a third aperture and a fourth aperture; and a second transparent element mount on and sealed to the third aperture of the second electrically conductive can, and wherein the fourth aperture of the second electrically conductive can is mounted on and sealed to the electrically conductive plating adhered to the sixth region of the second non-electrically conductive substrate so as to hermetically seal the second monitor diode and the second optical diode from an ambient atmosphere, and wherein the fourth through-hole has a longitudinal axis, and wherein the longitudinal axis of the fourth through-hole passes through at least one of the second optical diode and the second monitor diode, and wherein the first non-electrically conductive substrate and the second non-electrically conductive substrate are positioned on a plane, and wherein the first optical axis is substantially parallel to the second optical axis, and wherein the first optical axis is separated from the second optical axis by a distance of 3.25 millimeters or less, and whereby a conductive substrate and posts are absent so as to reduce a size of the optoelectronic packages.

28. The optoelectronic packages according to claim 27 wherein the first non-electrically conductive substrate has a rectangular shape, and wherein the second non-electrically conductive substrate has a rectangular shape.

29. The optoelectronic packages according to claim 28 wherein the first electrically conductive can has a rectangular shape, and wherein the second electrically conductive can has a rectangular shape.

30. The optoelectronic packages according to claim 27 wherein the apparatus is a transmitting optical subassembly.

31. The optoelectronic packages according to claim 27 wherein the apparatus is a receiving optical subassembly.

32. Optoelectronic packages comprising:

first non-electrically conductive substrate having a first surface and a second surface, the first surface separated from the second surface by a thickness of the first non-electrically conductive substrate, the first surface having a first region, a second region, and a third region, the first region having a first though-hole extending through the yhickness, the second region having a second through-hole extending through the thickness and a third through-hole extending through the thickness, the first region being separated from the third region by the second region;

an electrically conductive plating substantially covering both the first region and the third region of the first surface;

an electrically conductive material substantially filling the first through-hole so as to form a first electrically conductive via, the electrically conductive material substantially filing the second through-hole so as to form a second electrically conductive via, and the electrically conductive material substantially filling the third through-hole so as to form a third electrically conductive via, and the electrically conductive plating substantially covering the first region being electrically connected to the electrically conductive material substantially filling the first through-hole;

a first optical diode having a first lead and a second lead, the first lead of the first optical diode electrically connected to the electrically conductive plating of the first region, the first lead of the first optical diode electrically connected to the first electrically conductive via, the second lead of the first optical diode electrically connected to the second electrically conductive via, the first optical diode having a first optical axis;

a first monitor diode having a third lead and a fourth lead, the third lead of the first monitor diode electrically connected to the electrically conductive plating of the first region, the third lead of the first monitor diode electrically connected to the first electrically conductive via, the fourth lead of the first monitor diode electrically connected to the third electrically conductive via;

a first electrically conductive can having a first aperture and a second aperture;

a first transparent element mounted on and sealed to the first aperture of the first electrically conductive can, and wherein the second aperture of the first electrically conductive can is mounted on and sealed to the electrically conductive plating adhered to the third region of the non-electrically conductive substrate so as to hermetically seal the first monitor diode and the first optical diode from an ambient atmosphere, and wherein the first through-hole has a longitudinal axis, and wherein the longitudinal axis of the first through-hole passes through at least one of the first optical diode and the first monitor diode;

a second non-electrically conductive substrate having a third surface and a fourth surface, the third surface separated from the fourth surface by a thickness of the second non-electrically conductive substrate, the third surface having a fourth region, a fifth region, and a sixth region, the fourth region having a fourth through-hole extending through the thickness, the fifth region having a fifth through-hole extending through the thickness;

the electrically conductive plating substantially covering both the fourth region and the sixth region of the third surface;

the electrically conductive material substantially filling the fourth through-hole so as to form a fourth electrically conductive via, and the electrically conductive material substantially filling the fifth through-hole so as to form a fifth electrically conductive via, and the electrically conductive plating substantially covering the fourth region being electrically connected to the electrically conductive material substantially filling the fourth through-hole;

a second optical diode having a fifth lead and a sixth lead, the fifth lead of the second optical diode electrically connected to the electrically conductive plating of the fourth region, the fifth lead of the second optical diode electrically connected to the fourth electrically conductive via, the sixth lead of the second optical diode electrically connected to the fifth electrically conductive via, the second optical diode has a second optical axis;

a second electrically conductive can having a third aperture and a fourth aperture; and a second transparent element mount on and sealed to the third aperture of the second electrically conductive can, and wherein the fourth aperture of the second electrically conductive can is mounted on and sealed to the electrically conductive plating adhered to the sixth region of the second non-electrically conductive substrate so as to hermetically seal the second monitor diode and the second optical diode from an ambient atmosphere, and wherein the fourth through-hole has a longitudinal axis, and wherein the longitudinal axis of the fourth through-hole passes through the second optical diode, and wherein the first non-electrically conductive substrate and the second non-electrically conductive substrate are positioned on a plane, and wherein the first optical axis is substantially parallel to the second optical axis, and wherein the first optical axis is separated from the second optical axis by a distance of 3.25 millimeters or less, and whereby a conductive substrate and posts are absent so as to reduce a size of the optoelectronic packages.

33. The optoelectronic packages according to claim 32 wherein the first non-electrically conductive substrate has a rectangular shape, and wherein the second non-electrically conductive substrate has a rectangular shape.

34. The optoelectronic packages according to claim 33 wherein the first electrically conductive can has a rectangular shape, and wherein the second electrically conductive can has a rectangular shape.

35. The optoelectronic packages according to claim 32 wherein the apparatus is a transmitting optical subassembly.

36. The optoelectronic packages according to claim 32 wherein the apparatus is a receiving optical subassembly.

37. An optoelectronic package comprising:

a non-electrically conductive substrate having a first surface and a second surface, the first surface separated from the second surface by a thickness of the non-electrically conductive substrate, the first surface having a first region, a second region, and a third region, the first region having a first through-hole extending through the thickness, the second region having a second through-hole extending through the thickness, the first region being separated from the third region by the second region;

an electrically conductive plating substantially covering both the first region and the third region of the first surface;

an electrically conductive material substantially filling the first through-hole so as to form a first electrically conductive via, the electrically conductive material substantially filling the second through-hole so as to form a second electrically conductive via, and the electrically conductive plating substantially covering the first region being electrically connected to the electrically conductive material substantially filling the first through-hole;

an optical diode having a first lead and a second lead, the first lead of the optical diode electrically connected to the electrically conductive plating of the first region, the first lead of the optical diode electrically connected to the first electrically conductive via, the second lead of the optical diode electrically connected to the second electrically conductive via;

an electrically conductive can having a first aperture and a second aperture; and a transparent element mounted on and hermetically sealed to the first aperture of the electrically conductive can, and wherein the second aperture of the electrically conductive can is mounted on and sealed to the electrically conductive plating adhered to the third region of the non-electrically conductive substrate so as to hermetically seal the optical diode from an ambient atmosphere, and whereby a conductive substrate and posts are absent so as to reduce a size of the optoelectronic package.

38. The optoelectronic package according to claim 37 wherein the first electrically conductive via has a surface being substantially coplanar with the first surface of the non-electrically conductive substrate, and wherein the second electrically conductive via has a surface being substantially coplanar with the first surface of the non-electrically conductive substrate.

39. The optoelectronic package according to claim 37, further comprising a holder mounted to the non-electrically conductive substrate.

40. The optoelectronic package according to claim 39, further comprising a flex connector mounted on the second surface of the non-electrically conductive substrate, the flex connector having a first trace, and a second trace, wherein the first trace is electrically connected to the first via, and wherein the second trace is electrically connected to the second via.

41. The optoelectronic package according to claim 39 wherein the holder is made of a non-magnetic material.

42. The optoelectronic package according to claim 37 wherein the electrically conductive can is made of a non-magnetic material.

43. An optoelectronic package comprising:
- a non-electrically conductive substrate having a first region and a second region, the first region having a first through-hole, and the first region having a second through-hole;
- an electrically conductive plating substantially covering the second region;
- an electrically conductive material substantially filling the first through-hole so as to form a first electrically conductive via, and the electrically conductive material substantially filling the second through-hole so as to form a second electrically conductive via;
- an optical diode having a first lead and a second lead, the first lead of the optical diode electrically connected to the first electrically conductive via, and the second lead of the optical diode electrically connected to the second electrically conductive via;
- an electrically conductive can having a first aperture and a second aperture; and
- a transparent element mounted on and hermetically sealed to the first aperture of the electrically conductive can, and wherein
  - the second aperture of the electrically conductive can is mounted on and sealed to the electrically conductive plating adhered to the second region of the non-electrically conductive substrate so as to hermetically seal the optical diode from an ambient atmosphere, and whereby
  - a conductive substrate and posts are absent so as to reduce a size of the optoelectronic package.

44. The optoelectronic package according to claim 43 wherein the non-electrically conductive substrate has a rectangular shape.

* * * * *